US011339466B2

(12) United States Patent
Lavitsky et al.

(10) Patent No.: US 11,339,466 B2
(45) Date of Patent: May 24, 2022

(54) HEATED SHIELD FOR PHYSICAL VAPOR DEPOSITION CHAMBER

(71) Applicant: APPLIED MATERIALS, INC., Santa Clara, CA (US)

(72) Inventors: Ilya Lavitsky, San Francisco, CA (US); Keith A Miller, Mountain View, CA (US); Goichi Yoshidome, Albany, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 69 days.

(21) Appl. No.: 16/826,121

(22) Filed: Mar. 20, 2020

(65) Prior Publication Data
US 2021/0292888 A1 Sep. 23, 2021

(51) Int. Cl.
*C23C 14/34* (2006.01)
*C23C 14/50* (2006.01)

(52) U.S. Cl.
CPC .......... *C23C 14/3421* (2013.01); *C23C 14/50* (2013.01)

(58) Field of Classification Search
CPC ............. C23C 14/3421; C23C 14/50; H01J 37/32651; H01J 37/32477; H01J 37/32504; H01J 37/3441; H01J 37/3447; H01J 37/3488; H01J 37/3411; H01J 37/32807; H01J 37/32798; H01J 37/32431
USPC ........................................ 204/298.07, 298.11
See application file for complete search history.

(56) References Cited

U.S. PATENT DOCUMENTS

| 5,658,442 A * | 8/1997 | Van Gogh ........... H01J 37/3408 |
| | | 204/298.12 |
| 5,820,723 A * | 10/1998 | Benjamin ............... H01J 37/16 |
| | | 156/345.51 |
| 6,035,101 A * | 3/2000 | Sajoto ..................... C23C 16/46 |
| | | 392/416 |
| 6,342,691 B1 | 1/2002 | Johnsgard et al. |
| 6,627,056 B2 * | 9/2003 | Wang ................ H01J 37/32082 |
| | | 204/298.06 |
| 2008/0178801 A1 | 7/2008 | Hong et al. |

(Continued)

FOREIGN PATENT DOCUMENTS

| JP | 2009218324 A | 9/2009 |
| KR | 20070046765 A | 5/2007 |
| WO | WO-2017007729 A1 | 1/2017 |

OTHER PUBLICATIONS

International Search Report and Written Opinion dated Jul. 9, 2021 for PCT Application No. PCT/US2021/022445.

*Primary Examiner* — Jennifer Wecker
*Assistant Examiner* — Patrick S Ott
(74) *Attorney, Agent, or Firm* — Moser Taboada

(57) ABSTRACT

Embodiments of a process shield for use in a process chamber are provided herein. In some embodiments, a process shield for use in a process chamber includes a body having a cylindrical shape, wherein the body includes an upper portion and a lower portion, the upper portion having an outer lip and the lower portion extending downward and radially inward from the upper portion, wherein the outer lip includes a plurality of openings to accommodate fasteners, a plurality of alignment slots extending radially inward from an outer surface of the outer lip, and a notched lower peripheral edge, and wherein a lower surface of the outer lip includes a plurality of grooves.

20 Claims, 6 Drawing Sheets

(56) References Cited

U.S. PATENT DOCUMENTS

| | | | |
|---|---|---|---|
| 2008/0257263 A1* | 10/2008 | Pavloff | H01J 37/32477 |
| | | | 118/723 R |
| 2009/0260982 A1* | 10/2009 | Riker | H01J 37/3441 |
| | | | 204/298.11 |
| 2010/0032425 A1 | 2/2010 | Shimada | |
| 2010/0317197 A1 | 12/2010 | Lind et al. | |
| 2011/0278165 A1* | 11/2011 | Rasheed | C23C 14/35 |
| | | | 204/298.11 |
| 2013/0153412 A1* | 6/2013 | Ritchie | C23C 14/34 |
| | | | 204/298.06 |
| 2014/0262763 A1* | 9/2014 | Rasheed | H01J 37/32651 |
| | | | 204/298.07 |
| 2015/0075980 A1* | 3/2015 | Nguyen | C23C 14/34 |
| | | | 204/298.09 |
| 2015/0354054 A1* | 12/2015 | Fruchterman | H01J 37/3447 |
| | | | 204/298.06 |
| 2016/0189938 A1 | 6/2016 | Savandaiah et al. | |
| 2017/0002461 A1 | 1/2017 | Johanson et al. | |
| 2017/0076924 A1 | 3/2017 | Johanson et al. | |
| 2018/0087147 A1 | 3/2018 | Fu et al. | |
| 2018/0142340 A1* | 5/2018 | Johanson | C23C 14/34 |
| 2019/0096638 A1 | 3/2019 | Lavitsky et al. | |

* cited by examiner

HEATED SHIELD FOR PHYSICAL VAPOR DEPOSITION CHAMBER

FIELD

Embodiments of the present disclosure generally relate to substrate processing equipment.

BACKGROUND

Physical vapor deposition (PVD) is a process that may be used for depositing a thin film onto a substrate. A PVD process generally includes bombarding a target including a source material with ions from a plasma, causing the source material to be sputtered from the target. The ejected source material is then accelerated towards a substrate being processed, resulting in a deposition of the source material with or without reaction with other reactants. Deposition of the source material in a PVD chamber is accompanied by inner surfaces of the PVD chamber being coated as well.

Process kits, which can include multiple components, may be provided to reduce or prevent unwanted deposition on the inner surfaces of the PVD chamber. However, deposition build up on the process kits may require cleaning or replacement. Maintenance of the process kits typically includes removing the process kits from the PVD chamber, chemically etching the process kits, and reinstalling the process kits into the PVD chamber. The inventors propose performing the chemical etching process in situ. However, for certain in situ cleaning processes, a high chamber temperature may be required.

Accordingly, the inventors have provided herein improved process kits for high chamber temperature processes.

SUMMARY

Embodiments of a process shield for use in a process chamber are provided herein. In some embodiments, a process shield for use in a process chamber includes a body having a cylindrical shape, wherein the body includes an upper portion and a lower portion, the upper portion having an outer lip and the lower portion extending downward and radially inward from the upper portion, wherein the outer lip includes a plurality of openings to accommodate fasteners, a plurality of alignment slots extending radially inward from an outer surface of the outer lip, and a notched lower peripheral edge, and wherein a lower surface of the outer lip includes a plurality of grooves.

In some embodiments, a process kit for use in a process chamber includes a process shield having a cylindrical body with an upper portion and a lower portion, the upper portion having an outer lip and the lower portion extending downward and radially inward from the upper portion, wherein a plurality of alignment slots extend radially inward from an outer surface of the outer lip; and a heater ring coupled to the upper portion of the process shield via a plurality of openings in the outer lip, wherein the heater ring includes a resistive heating element embedded therein, and wherein the heater ring includes a plurality of pin slots corresponding with a location of the plurality of alignment slots of the process shield.

In some embodiments, a process chamber includes a chamber body defining an interior volume therein; a target disposed in the interior volume proximate a top of the chamber body; a substrate support disposed in the interior volume opposite the target; a shield having a cylindrical body that extends from the target to the substrate support, the shield having an outer lip; an adapter surrounding the shield, the adapter having a cooling channel disposed therein; and a heater ring fastened to the outer lip of the shield via a plurality of openings in the outer lip to clamp the adapter between the outer lip and the heater ring.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
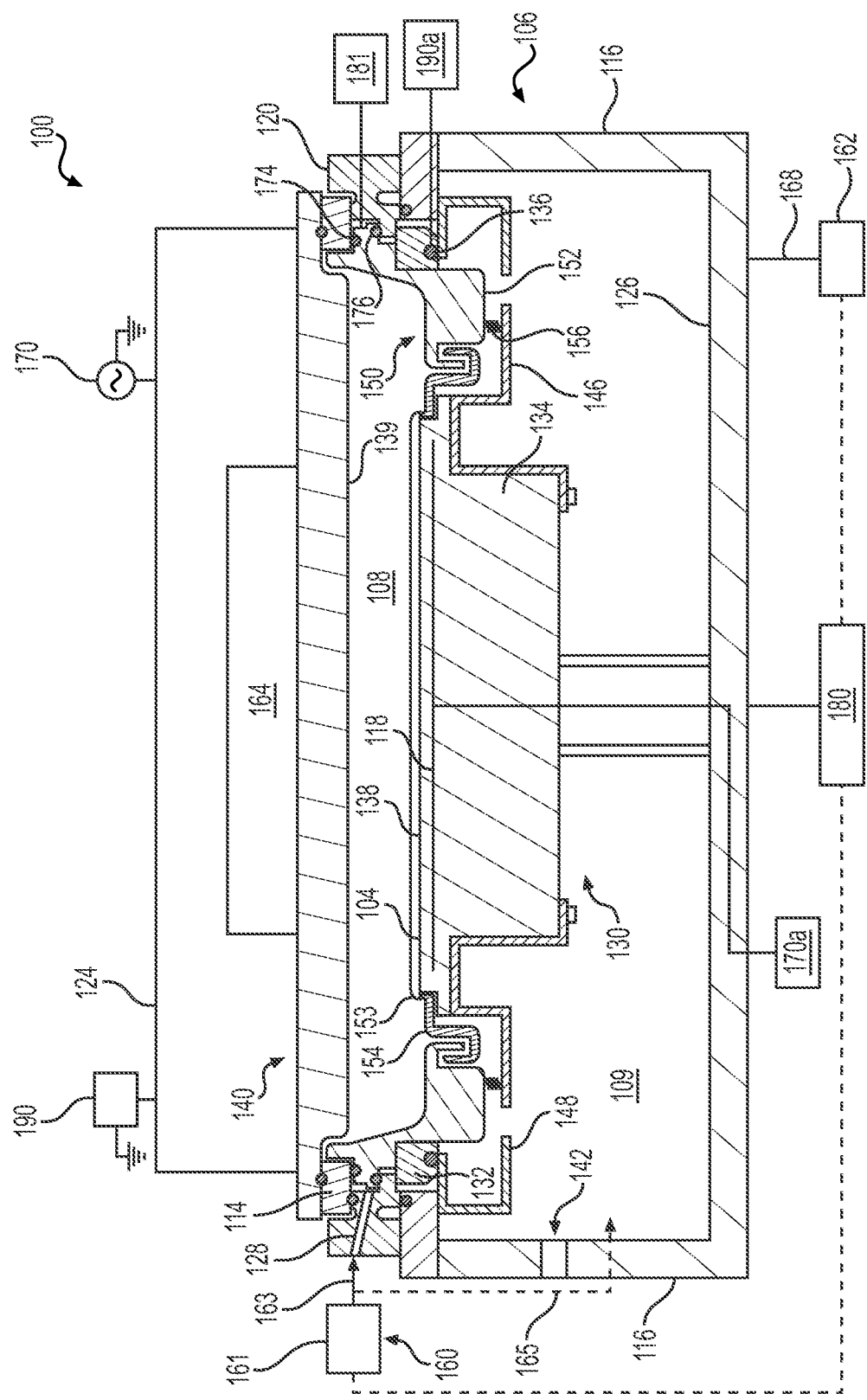
FIG. 1 is a schematic side view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of process kits for use in a PVD chamber are provided herein. Process kits, as described herein, may include multiple components, including a process shield. In some embodiments, the process shield is advantageously thermally decoupled from adjacent cooled components of the process chamber, such as a water-cooled adapter or water-cooled sidewalls of the process chamber, so that the process shield can be heated to high temperatures (e.g., temperatures of 250 degrees Celsius or greater). In some embodiments, the process shield is advantageously electrically coupled to the cooled adapter or cooled sidewalls of the process chamber to electrically ground the process shield.

FIG. 1 depicts a schematic side view of a process chamber 100 in accordance with some embodiments of the present disclosure. In some embodiments, the process chamber 100 is a physical vapor deposition (PVD) chamber. Examples of PVD chambers suitable for use with the present disclosure include the APPLIED ENDURA IMPULSE™ and other PVD processing chambers commercially available from Applied Materials, Inc., of Santa Clara, Calif. Other processing chambers from Applied Materials, Inc. or other manufactures may also benefit from the inventive apparatus disclosed herein.

The process chamber 100 comprises chamber walls 106 that enclose an inner volume having a processing volume 108 and a non-processing volume 109. The chamber walls 106 include sidewalls 116, a bottom wall 126, and a ceiling 124. The ceiling 124 may be a chamber lid or a similar cover to seal off the inner volume. The process chamber 100 can be a standalone chamber or a part of a multi-chamber platform (not shown) such as for example, any of the ENDURA®, CENTURA®, or PRODUCER® lines of process systems having a cluster of interconnected chambers connected by a substrate transfer mechanism that transfers substrates 104 between the various chambers (e.g., a substrate transfer robot). The process chamber 100 may be a PVD chamber capable of sputter depositing material onto a substrate 104. Non-limiting examples of suitable materials for sputter deposition include one or more of aluminum, copper, tantalum, tantalum nitride, titanium, titanium nitride, tungsten, tungsten nitride, and the like.

The process chamber 100 comprises a substrate support 130 which comprises a pedestal 134 to support the substrate 104. The pedestal 134 has a substrate support surface 138 having a plane substantially parallel to a sputtering surface 139 of a target 140 disposed in an upper section of the process chamber 100. The target 140 may include material to be sputtered onto a substrate 104 and a backing plate. The substrate support surface 138 of the pedestal 134 is configured to receive and support the substrate 104 during processing. The pedestal 134 may include an electrostatic chuck having an electrode 118 or a heater (such as an electrical resistance heater, heat exchanger, or other suitable heating device). The electrode 118 may be coupled to an electrode power source 170b. The electrode power source 170b may be a DC power source or an RF power source. In operation, the substrate 104 is introduced into the non-processing volume 109 of the process chamber 100 through a slit valve 142 in the sidewall 116 of the process chamber 100 and placed onto the substrate support 130, which is in a non-processing position during loading of the substrate 104. The substrate support 130 can be lifted or lowered by a support lift mechanism and a lift finger assembly can be used to lift and lower the substrate 104 onto the substrate support 130 during placement of the substrate 104 on the substrate support 130 by a robot arm. The pedestal 134 can be maintained at an electrically floating potential or grounded during plasma operation.

The process chamber 100 also contains a process kit 150, which comprises various components that can be easily removed from the process chamber 100, for example, to clean sputtering deposits off the component surfaces, replace or repair eroded components, or to adapt the process chamber 100 for other processes. The process kit 150 includes a process shield 152. The process shield 152 has a diameter sized to encircle the sputtering surface 139 of the target 140 and the substrate support 130 (e.g., a diameter larger than the sputtering surface 139 and larger than the support surface of the substrate support 130). The process shield 152 may be made of aluminum, an aluminum alloy, titanium, a titanium allow, stainless steel, or a ceramic.

A DC power source 190 can apply a bias voltage to the target 140 relative to the process shield 152 of the process kit 150, which may be electrically floating during a sputtering process and/or the cleaning process. The process kit 150 may include a heater ring 132 coupled to the process shield 152 to heat the process shield 152 to a suitable temperature for performing a sputtering process or cleaning process. In some embodiments, the process kit 150 includes an adapter 120 surrounding the process shield 152. In some embodiments, the process shield 152 and the heater ring 132 are coupled such that they clamp the adapter 120 or a portion of the sidewalls 116 therebetween (described in further detail below). In some embodiments, the adapter 120 includes a cooling channel 232 disposed therein. The cooling channel 232 is configured to facilitate the flow of a coolant therethrough to cool the adapter. In some embodiments, the adapter is cooled to a temperature of about 20 degrees Celsius to about 50 degrees Celsius.

In some embodiments, the process shield 152 includes a plurality of grooves (see FIG. 8) to accommodate spring members 176, such as RF gaskets, disposed between the process shield 152 and the adapter 120. The spring members 176 are configured to electrically couple the process shield 152 and the adapter 120. In some embodiments, the process shield 152 includes a plurality of grooves 602 (see FIGS. 6 and 7) to accommodate spring members 174, such as RF gaskets, disposed between the process shield 152 and an isolator ring 114. The isolator ring 114 is configured to electrically isolate the target 140 from the process shield 152. The spring members 174 advantageously maintain a uniform gap between the process shield 152 and the target 140.

In some embodiments, the heater ring 132 comprises copper or a copper alloy. The heater 136 may comprise a heating element, such as a resistive heating element, embedded within or otherwise coupled to the heater ring 132. In some embodiments, a suitable temperature for performing a cleaning process is about 250 degrees to about 350 degrees Celsius. The DC power source 190, or a second DC power source 190a, can also be used to apply a bias voltage to a heater 136 of the heater ring 132 (e.g., when performing a cleaning process of the process shield 152).

In some embodiments, the process kit 150 further comprises a deposition ring 154 disposed on the pedestal 134 and between the process shield 152 and the substrate support 130. The deposition ring 154 and process shield 152 define a tortuous gas flow path therebetween and cooperate with one another to reduce formation of sputter deposits on the peripheral walls of the substrate support 130 and an overhanging edge 153 of the substrate 104.

In some embodiments, the process kit 150 includes a reflective liner 148 to protect interior surfaces of the process chamber 100 from unwanted sputtering deposits and reduce thermal loss by reflecting heat from the heater ring 132 back to the process shield 152. In some embodiments, the reflective liner 148 is coupled to at least one of the heater ring 132 and the adapter 120. In some embodiments, the reflective liner 148 has an "L" shaped or "C" shaped cross-section.

In some embodiments, the process kit 150 includes a grounding bracket 146 coupled to the substrate support 130. In some embodiments, the grounding bracket is coupled to grounding loops 156. The grounding loop 156 are configured to contact a bottom surface of the process shield 152 and electrically ground the process shield 152 when the substrate support 130 is in a raised position and to be space apart from the process shield 152 when the substrate support 130 is in a lowered position.

The process chamber 100 is coupled to a gas delivery system 160 having a gas source 161 configured to supply process gases to the processing volume 108. In some embodiments, process gas from the gas source 161 is flowed to the process kit 150 via conduit 163 and is flowed through the process kit 150 into the processing volume 108 (described in more detail below with respect to FIG. 2). In some embodiments, the process kit 150 includes at least one gas delivery channel 128. In some embodiments, the at least one gas delivery channel 128 includes two gas delivery channels that are diametrically opposed to provide more uniform gas delivery. In some embodiments, the at least one gas delivery channel 128 extends from an outer surface of the adapter 120 to an inner surface of the adapter 120. In some embodiments, the at least one gas delivery channel 128 extends downward and radially inward from an outer surface of the adapter 120 to an inner surface of the adapter 120. The inventors have discovered that by incorporating the gas supply into the process kit 150, throughput can advantageously be increased since the processing volume 108 receives process gases, thus reducing the amount of time to provide process gases to the processing volume 108. In some embodiments, process gas from the gas source 161 is flowed through sidewalls 116 via conduit 165, then flowed to the non-processing volume 109 and then to the processing volume 108. Conduit 163 and conduit 165 may include gas flow control valves (not shown), such as mass flow controllers, to pass a set flow rate of the process gas therethrough.

The process gas may comprise a non-reactive gas, such as argon or xenon, which is capable of energetically impinging upon and sputtering material from the target 140 onto the substrate 104. The process gas may comprise a reactive gas, such as one or more of an oxygen-containing gas and a nitrogen-containing gas, that can react with the sputtered material to form a layer on the substrate 104. The gas is then energized by an RF power source 170 to form or create a plasma to sputter the target 140. For example, the process gases become ionized by high energy electrons and the ionized gases are attracted to the sputtering material, which is biased at a negative voltage. In some embodiments, the reactive gases can directly react with the target 140 to create compounds and then be subsequently sputtered from the target 140. In such embodiments, the target 140 can be energized by both the DC power source 190 and the RF power source 170. In some embodiments, the DC power source 190 can be configured to provide pulsed DC to power the target 140.

For a cleaning process around the process kit 150, the process gas may include oxygen, or other oxygen containing gases including, for example, ozone, hydroxide, or peroxide. In some embodiments, the process gas may include chlorine, diatomic chlorine, or other chlorine containing gases. The type of gas used can depend on, for example, the type of target material, the type of chamber (e.g., PVD, CVD, etc.), a manufacturer's preference, etc.

In some embodiments, RF energy supplied by the RF power source 170 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. An additional RF power source can also be used to supply a bias voltage to the pedestal 134 and/or the process shield 152 (e.g., when performing a cleaning process of the area around the process kit 150). For example, in some embodiments an additional RF power source 170a can be used to energize the electrode 118. The electrode 118 can be used to supply power to the process shield 152 and/or the pedestal 134. Moreover, in some embodiments, the RF power source 170 can be configured to energize the electrode 118. One or more additional components (e.g., a switching circuit) can be provided to switch the electrical path from the cover or ceiling 124 to the electrode 118.

Spent process gas and byproducts are exhausted from the process chamber 100 through an exhaust pump 162. The exhaust pump 162 receives spent process gas via an exhaust conduit 168 having a throttle valve (not shown) to control the pressure of the gas in the process chamber 100. The exhaust conduit 168 is connected to the exhaust pump 162 comprising one or more pumps (one shown).

In some embodiments, the process chamber 100 may include a magnetic field generator 164 disposed above the target 140 to shape a magnetic field about the target 140 to improve sputtering of the target 140. The capacitively generated plasma may be enhanced by a magnetic field generator 164 in which for example, a permanent magnet or electromagnetic coils may provide a magnetic field in the process chamber 100 that has a rotating magnetic field having a rotational axis that is perpendicular to the plane of the substrate 104. The process chamber 100 may, in addition or alternatively, comprise a magnetic field generator 164 that generates a magnetic field near the target 140 of the process chamber 100 to increase an ion density in a high-density plasma region adjacent to the target 140 to improve the sputtering of the target material.

Various components of the process chamber 100 may be controlled by a controller 180. The controller 180 comprises program code having instruction sets to operate the components to process the substrate 104. For example, the controller 180 can comprise program code that includes substrate positioning instruction sets to operate the substrate support 130 and substrate transfer mechanism; power control of a microwave power source 181, which is configured to create a plasma in the processing volume 108 of the process chamber 100 when the area around the process kit 150 needs to be cleaned; gas flow control instruction sets to operate gas flow control valves to set a flow of sputtering gas to the process chamber 100; gas pressure control instruction sets to operate the maintain a pressure in the process chamber 100; temperature control of one or more heating components of the heater 136; cleaning process instruction sets to an area around the process kit 150; gas energizer control instruction sets to operate the RF power source 170 to set a gas energizing power level; temperature control instruction sets to control a temperature control system in the substrate support 130 or a heat transfer medium supply to control a flowrate of heat transfer medium to one or more annular heat transfer channels; and process monitoring instruction sets to monitor the process in the process chamber 100. Various components of the process chamber 100 may be controlled by a controller 180.

Figure 2:
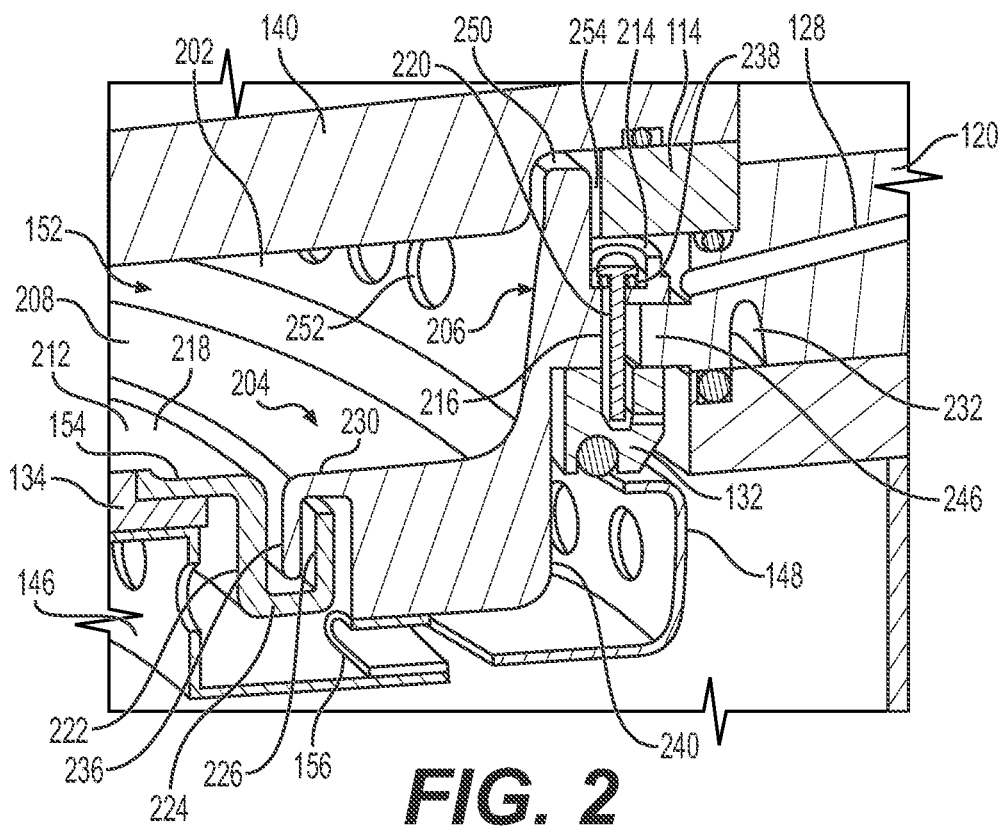
FIG. 2 is a partial cross-sectional isometric view of a process chamber in accordance with some embodiments of the present disclosure.

FIG. 2 is a partial cross-sectional isometric view of a process chamber in accordance with some embodiments of the present disclosure. In some embodiments, the process shield 152 includes a body 202 having a cylindrical shape. The body includes an upper portion 206 and a lower portion 204. In some embodiments, the process shield 152 includes a plurality of vents 252 to increase flow conductance through the process shield 152. In some embodiments, the plurality of vents 252 are arranged around the process shield 152. In some embodiments, the plurality of vents 252 are arranged at regular intervals around the process shield 152. In some embodiments, the plurality of vents 252 are arranged in an axisymmetric pattern around the process shield 152 with respect to a central axis extending along the central opening of the process shield 152. In some embodiments, each vent of the plurality of vents 252 is a circle, an oval, or other shaped opening. The lower portion 204 extends downward and radially inward from the upper portion 206. A processing volume facing surface of the upper portion 206 is continuous with a processing volume facing surface of the lower portion 204. In some embodiments, an outer surface 240 of the lower portion 204 from a bottom of the upper portion 206 to a bottom of the process shield 152, is substantially vertical. In some embodiments, the outer surface 240 is entirely disposed radially outward of the processing volume facing surface of the upper portion 206.

In some embodiments, an upper surface 208 of the lower portion 204 is substantially horizontal. In some embodiments, the upper surface 208 is substantially coplanar with an adjacent portion of the upper surface 212 of the deposition ring 154. In some embodiments, the lower portion 204 includes an inner lip 230 extending radially inward form a body of the lower portion 204. In some embodiments, a first leg 236 extends downward from an innermost portion of the inner lip 230. In some embodiments, the first leg 236 extends to a location between the upper surface 208 and a lower surface of the lower portion 204. An inner surface of the first leg 236 defines an innermost surface of the lower portion 204.

In some embodiments, the deposition ring 154 includes an inner portion 218 that rests on the pedestal 134. In some embodiments, an upper surface of the inner portion 218 defines the upper surface 212 of the deposition ring 154. In some embodiments, a first leg 222 of the deposition ring 154 extends downward from the inner portion 218. In some embodiments, the deposition ring 154 includes an outer portion 224 extending radially inward from the first leg 222. In some embodiments, a second leg 226 of the deposition ring 154 extends upward from the outer portion 224. In some embodiments, the first leg 222, the outer portion 224, and the second leg 226 are disposed about the first leg 236 of the process shield 152 to define a tortuous gas flow path therebetween.

Figure 6:
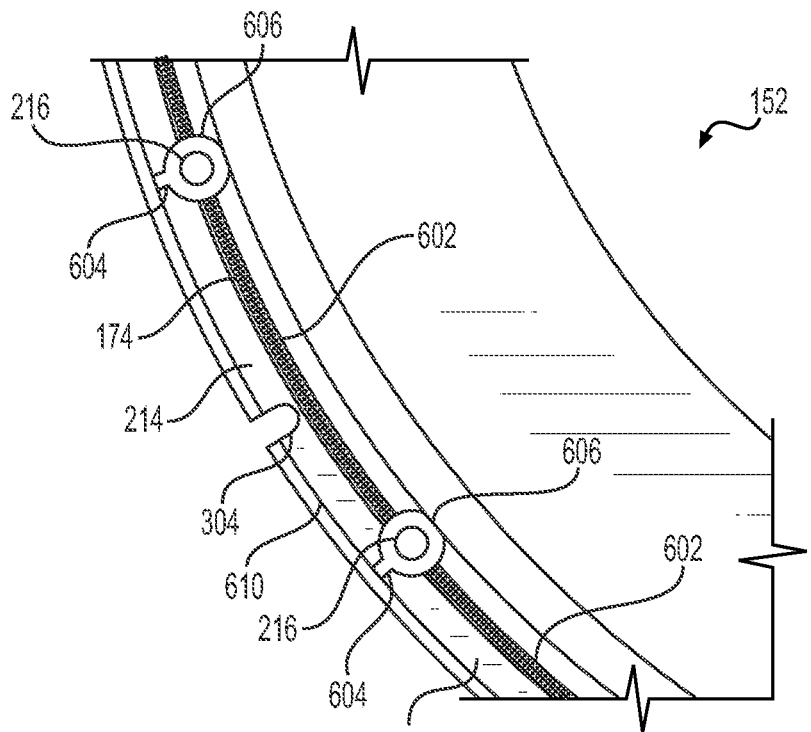
FIG. 6 is a partial top view of a process shield in accordance with some embodiments of the present disclosure.
Figure 7:
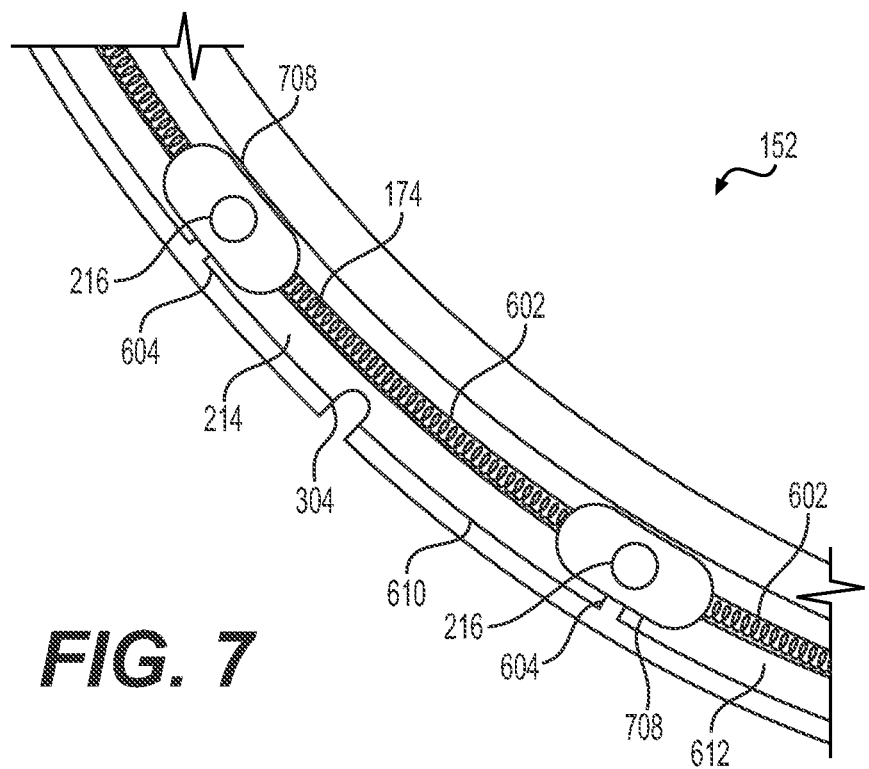
FIG. 7 is a partial top view of a process shield in accordance with some embodiments of the present disclosure.

In some embodiments, the upper portion 206 includes an outer lip 214. The outer lip 214 includes a plurality of openings 216 to accommodate fasteners 220 for fastening the heater ring 132 to the process shield 152. FIGS. 6 and 7 are partial top views of a process shield 152 in accordance with some embodiments of the present disclosure. In some embodiments, each one of the plurality of openings 216 includes a counterbore 606 to accommodate one of the fasteners 220. In some embodiments, as shown in FIG. 6, the counterbore 606 has a substantially circular shape. In some embodiments, each one of the plurality of openings 216 includes a counterbore 608 to accommodate one of the fasteners 220. In some embodiments, as shown in FIG. 7, the counterbore 608 has a substantially oval or elongated circle shape. In some embodiments, the outer lip 214 of the process shield 152 includes a plurality of radial gas distribution channels 604 extending from the plurality of openings 216 to an outer surface 610 of the outer lip 214.

In some embodiments, an upper surface 612 of the outer lip 214 includes a plurality of grooves 602 to accommodate spring members 174. In some embodiments, the plurality of grooves 602 are disposed at regular intervals about the process shield 152. The spring members 174, when disposed in the plurality of grooves 602, extend beyond the upper surface 612 of the outer lip 214 to maintain a desired gap between the process shield 152 and the target 140. In some embodiments, each of the plurality of grooves 602 extend between adjacent openings of the plurality of openings 216. In some embodiments, each of the plurality of grooves 602 extend from sidewalls of adjacent counterbores 606, 608.

Figure 8:
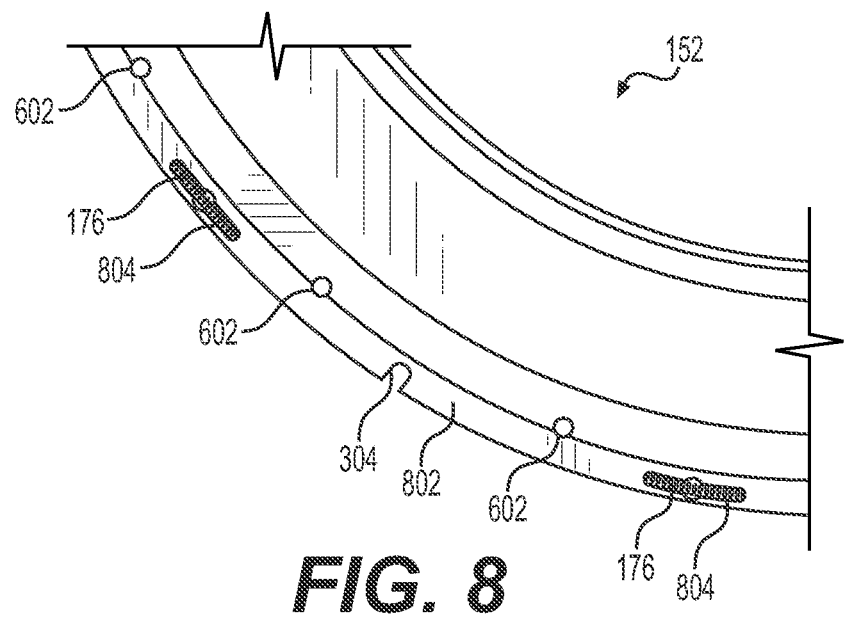
FIG. 8 is a partial bottom view of a process shield in accordance with some embodiments of the present disclosure.

FIG. 8 is a partial bottom view of a process shield in accordance with some embodiments of the present disclosure. In some embodiments, a lower surface 802 of the outer lip 214 includes a plurality of grooves 804 to accommodate the spring members 176. In some embodiments, the plurality of grooves 804 are arranged at regular intervals about the process shield 152. In some embodiments, the plurality of grooves 804 on the lower surface 802 of the outer lip 214 extend for a shorter length than the plurality of grooves 602 on the upper surface 612 of the outer lip 214. For example, the spring members 174 may have a length of about 1.5 inches to about 3.5 inches. For example, the spring members 176 may have a length of about 0.5 inches to about 1.5 inches. The plurality of grooves 804 are configured to house the spring members 176 to maintain electrical coupling between the process shield 152 and another chamber component, for example, the adapter 120 or sidewalls 116.

Returning back to FIG. 2, in some embodiments, an insert 238 is disposed in each one of the plurality of openings 216 (e.g., in counterbore 606 or counterbore 708) between each one of the fasteners 220 and the process shield 152 to increase a contact area between the process shield and the fasteners 220. An increased contact area advantageously reduces deformation of the process shield 152 and reduces loosening of the fasteners 220. As such, counterbore 708 can accommodate an insert 238 having a greater contact area with the process shield 152 than counterbore 606. In some embodiments, the insert 238 comprises at least one of a conical washer and a flat washer. In some embodiments, the insert 238 is shaped similar to the counterbore 708.

In some embodiments, the outer lip 214 includes a notched lower peripheral edge to accommodate the adapter 120. In some embodiments, an inner lip 246 of the adapter 120 is advantageously clamped between the outer lip 214 and the heater ring 132 via the fasteners 220. In some embodiments, the outer lip 214 includes a notched upper peripheral edge to accommodate the isolator ring 114.

The process kit 150 defines a gas flow path therethrough. In some embodiments, the gas flow path extends from a region between the adapter 120 and the process shield 152 through the plurality of radial gas distribution channels 604 through a first gap 254 between the isolator ring 114 and the process shield 152 and through a second gap 250 between the target 140 and the process shield 152 to a region within the cylindrical body of the process shield 152. The first gap 254 and the second gap 250 are sized to accommodate for thermal expansion of the process shield 152 without contacting the target 140 or the isolation ring 114 when the process shield 152 is heated.

Figure 3:
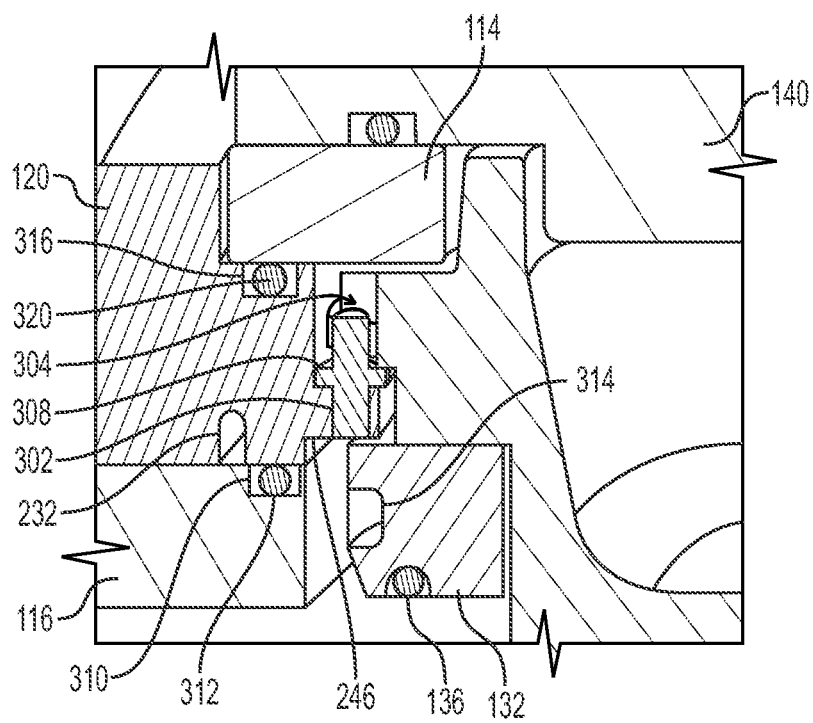
FIG. 3 is a partial cross-sectional isometric view of a process chamber in accordance with some embodiments of the present disclosure.

FIG. 3 is a partial cross-sectional isometric view of a process chamber in accordance with some embodiments of the present disclosure. In some embodiments, the inner lip 246 of the adapter 120 includes a plurality of alignment pins 302 to align the process shield 152 to the adapter 120. Each one of the plurality of alignment pins 302 extend into an alignment slot 304 of the process shield 152 to align the process shield 152 to the adapter 120. In some embodiments, the process shield 152 rests on a shoulder 308 of each of the alignment pins 302. The alignment pins 302 are configured to provide a gap between the inner lip 246 of the adapter 120 and the outer lip 214 of the process shield 152 to reduce or prevent thermal coupling between the adapter 120 and the process shield 152. Thermal decoupling of the adapter 120 and the process shield 152 advantageously facilitates heating the process shield 152 to temperatures greater than 250 degrees Celsius while the adapter 120 has a temperature of about 20 degrees Celsius to about 50 degrees Celsius. In some embodiments, the alignment pins 302 comprise three pins that are spaced about 120 degrees from each other. In some embodiments, the alignment pins 302 provide a gap of about 0.005 inches to about 0.02 inches between an upper surface of the inner lip 246 of the adapter 120 and a lower surface of the outer lip 214 of the process shield 152.

In some embodiments, the heater ring 132 includes a cooling channel 314 for circulating a coolant therethrough to provide increased temperature control of the heater ring 132 and the process shield 152. In some embodiments, an upper surface of the sidewalls 116 includes an o-ring groove 310 to receive an o-ring 312 to form a vacuum seal between the adapter 120 and the sidewalls 116. In some embodiments, the adapter 120 includes a notched upper interior edge to accommodate the isolation ring 114. In some embodiments, a surface defined by the notched upper interior edge includes an o-ring groove 316 to receive an o-ring 320 to form a vacuum seal between the adapter 120 and the isolation ring 114.

Figure 4:
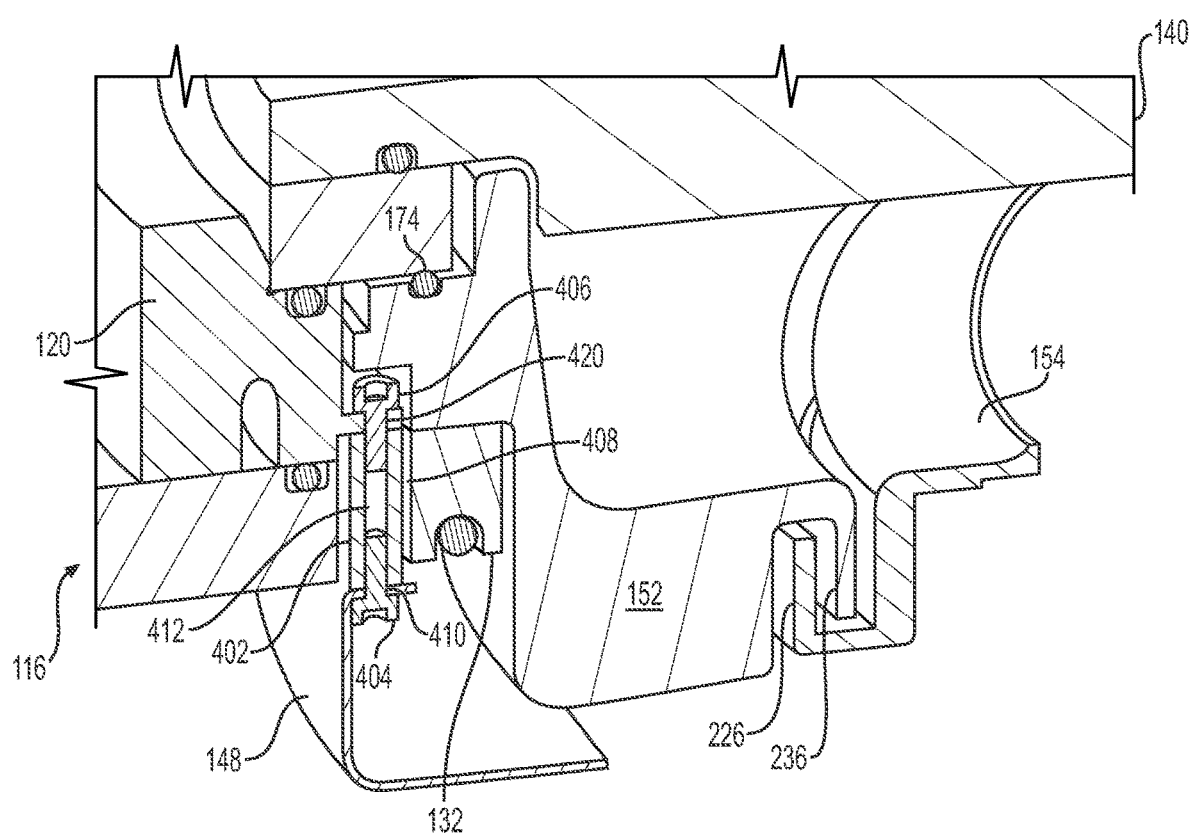
FIG. 4 is a partial cross-sectional isometric view of a process chamber in accordance with some embodiments of the present disclosure.

FIG. 4 is a partial cross-sectional isometric view of a process chamber in accordance with some embodiments of the present disclosure. In some embodiments, the reflective liner 148 is coupled to the adapter 120. In some embodiments, the reflective liner 148 is coupled to the adapter 120 via a plurality of standoffs 402. In some embodiments, the plurality of standoffs 402 extend into a plurality of cutouts 408 of the heater ring 132. In some embodiments, the plurality of cutouts 408 extend radially inward from an outer surface of the heater ring 132. In some embodiments, the plurality of standoffs 402 include a central opening 412. A plurality of first fasteners 406 may extend through openings 420 in the adapter 120 and into the central opening 412 at a first end of each respective standoff of the plurality of standoffs 402 to couple the adapter 120 to the plurality of standoffs 402. A plurality of second fasteners 404 may extend through openings 410 in the reflective liner 148 and into the central opening 412 at a second end of each respective standoff of the plurality of standoffs 402 to couple the reflective liner 148 to the plurality of standoffs 402 and, by extension, the adapter 120.

Figure 5:
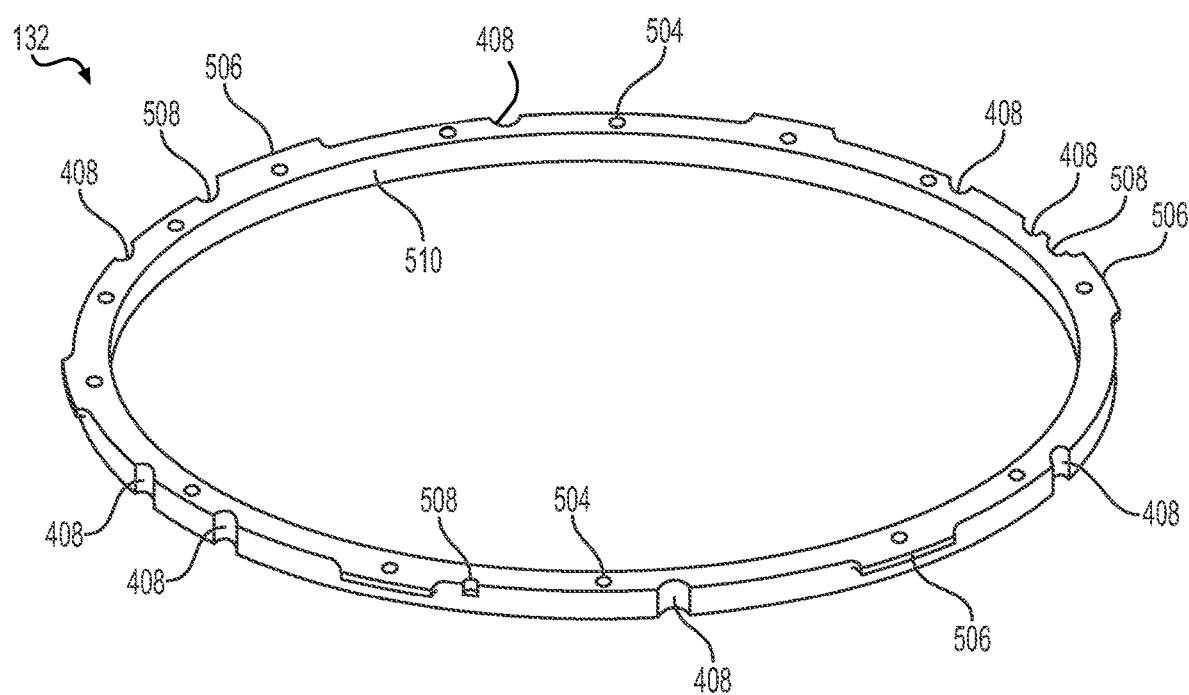
FIG. 5 is a top isometric top view of a heater ring in accordance with some embodiments of the present disclosure.

FIG. 5 is a top isometric top view of a heater ring 132 in accordance with some embodiments of the present disclosure. The heater ring 132 includes a plurality of openings 504 corresponding with the plurality of openings 216 of the process shield 152 to facilitate coupling the process shield 152 to the heater ring 132. In some embodiments, the heater ring 132 includes a plurality of pin slots 508 corresponding with a location of the alignment pins 302. In some embodiments, the plurality of pin slots 508 include three slots. In some embodiments, the plurality of cutouts 408 includes eight cutouts.

In some embodiments, the heater ring 132 includes a plurality of location tabs 506 extending radially outward from a body 510 of the heater ring 132. The plurality of location tabs 506 may rest on a chamber component when the heater ring 132 is disposed in the process chamber 100 to align the heater ring 132. For example, in some embodiments, the plurality of location tabs 506 rest on sidewalls 116.

Figure 9:
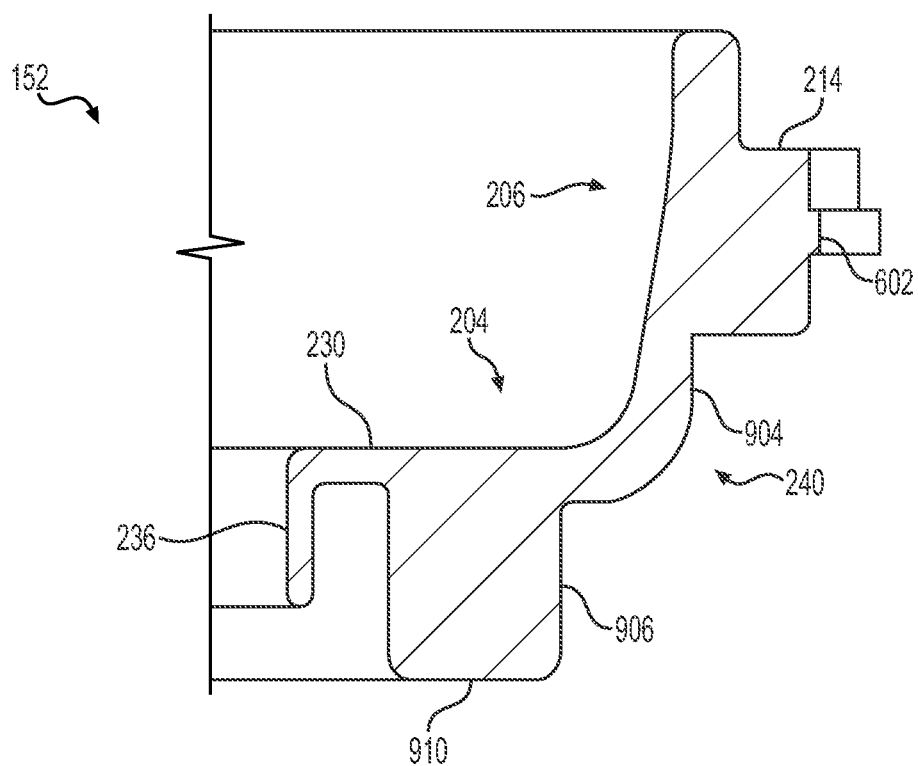
FIG. 9 is a cross-sectional side view of a process shield in accordance with some embodiments of the present disclosure.

FIG. 9 is a cross-sectional side view of a process shield in accordance with some embodiments of the present disclosure. In some embodiments, the outer surface 240 of the lower portion 204 includes a first portion 904 that extends downward and radially inward from the outer lip 214. In some embodiments, the outer surface 240 includes a second portion 906 that extends down from the first portion 904 to a lower surface 910 of the process shield 152. In some embodiments, the second portion 906 extends substantially vertically downward. In some embodiments, the second portion 906 is disposed radially inward of the first portion 904.

While the foregoing is directed to embodiments of the present disclosure, other and further embodiments of the disclosure may be devised without departing from the basic scope thereof.

The invention claimed is:

1. A process shield for use in a process chamber, comprising:
a body having a cylindrical shape, wherein the body includes an upper portion and a lower portion, the upper portion having an outer lip and the lower portion extending downward and radially inward from the upper portion, wherein the outer lip includes a plurality of openings to accommodate fasteners, a plurality of alignment slots extending radially inward from an outer surface of the outer lip, and a notched lower peripheral edge, and wherein a lower surface of the outer lip includes a plurality of grooves.

2. The process shield of claim 1, wherein the outer lip of the process shield includes radial gas distribution channels extending from the plurality of openings in the outer lip to the outer surface of the outer lip.

3. The process shield of claim 1, wherein an upper surface of the outer lip includes a plurality of grooves disposed at regular intervals to accommodate spring members.

4. The process shield of claim 3, wherein the plurality of grooves on the upper surface of the outer lip extend between adjacent openings of the plurality of openings.

5. The process shield of claim 1, wherein the lower portion includes an inner lip that extends radially inward and a leg that extends vertically downward from an innermost portion of the inner lip.

6. A process kit for use in a process chamber, comprising:
a process shield having a cylindrical body with an upper portion and a lower portion, the upper portion having an outer lip and the lower portion extending downward and radially inward from the upper portion, wherein a plurality of alignment slots extend radially inward from an outer surface of the outer lip; and
a heater ring coupled to the upper portion of the process shield via a plurality of openings in the outer lip, wherein the heater ring includes a resistive heating element embedded therein, and wherein the heater ring includes a plurality of pin slots corresponding with a location of the plurality of alignment slots of the process shield.

7. The process kit of claim 6, wherein the outer lip of the process shield includes a radial gas distribution channel extending from at least one of the plurality of openings in the outer lip to a radially outer surface of the process shield.

8. The process kit of claim 6, wherein at least one of an upper surface of the outer lip or a lower surface of the outer lip includes a plurality of grooves disposed at regular intervals to accommodate spring members.

9. The process kit of claim 6, further comprising an adapter surrounding the process shield, the adapter having a cooling channel disposed therein, wherein the adapter is clamped between the process shield and the heater ring.

10. The process kit of claim 9, wherein the adapter includes a gas delivery channel extending from an outer surface of the adapter to an inner surface of the adapter.

11. The process kit of claim 9, wherein one or more spring members are disposed between the process shield and the adapter to electrically couple the process shield to the adapter.

12. The process kit of claim 9, wherein the adapter includes an inner lip and the inner lip includes a plurality of alignment pins to align the process shield to the adapter, and wherein the alignment pins are configured to provide a gap between the inner lip of the adapter and the outer lip of the process shield.

13. The process kit of claim 9, further comprising a reflective liner coupled to the adapter via standoffs through cutouts in the heater ring.

14. The process kit of claim 6, further comprising a deposition ring disposed between the process shield and a substrate support.

15. The process kit of claim 6, wherein an upper surface of the lower portion is substantially horizontal.

16. A process chamber, comprising:
 a chamber body defining an interior volume therein;
 a target disposed in the interior volume proximate a top of the chamber body;
 a substrate support disposed in the interior volume opposite the target;
 a shield having a cylindrical body that extends from the target to the substrate support, the shield having an outer lip;
 an adapter surrounding the shield, the adapter having a cooling channel disposed therein; and
 a heater ring coupled to the outer lip of the shield via a plurality of fasteners disposed through a plurality of openings in the outer lip and extending into the heater ring to clamp the adapter between the outer lip and the heater ring.

17. The process chamber of claim 16, wherein the adapter includes an inner lip and the inner lip includes a plurality of alignment pins, wherein each of the plurality of alignment pins extend into an alignment slot of the shield to align the shield to the adapter while providing a gap between the inner lip of the adapter and the outer lip of the shield.

18. The process chamber of claim 16, further comprising a deposition ring disposed between the shield and the substrate support, wherein the deposition ring includes an upper surface substantially coplanar with an upper surface of a lower portion of the shield.

19. The process chamber of claim 16, further comprising a grounding bracket coupled to the substrate support and configured to be electrically coupled to the shield to ground the shield when the substrate support is in a raised position, and spaced apart from the shield when the substrate support is in a lowered position.

20. The process chamber of claim 16, further comprising an isolator ring, wherein a gas flow path extends through a first gap between the isolator ring and the shield and through a second gap between the target and the shield to a region within the cylindrical body of the shield.

\* \* \* \* \*